(12) United States Patent
Huang et al.

(10) Patent No.: US 10,630,234 B2
(45) Date of Patent: Apr. 21, 2020

(54) EXPANDABLE PHOTOVOLTAIC SUBMODULES

(71) Applicant: INDUSTRIAL TECHNOLOGY RESEARCH INSTITUTE, Hsinchu (TW)

(72) Inventors: Chien-Rong Huang, New Taipei (TW); Tung-Po Hsieh, Hsinchu (TW); Fu-Ming Lin, Hsinchu County (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 201 days.

(21) Appl. No.: 15/389,159

(22) Filed: Dec. 22, 2016

(65) Prior Publication Data

US 2018/0175227 A1    Jun. 21, 2018

(30) Foreign Application Priority Data

Dec. 21, 2016    (TW) .............................. 105142567 A

(51) Int. Cl.
*H02S 40/34* (2014.01)
*H02S 40/36* (2014.01)
*H01L 31/02* (2006.01)

(52) U.S. Cl.
CPC ........ *H02S 40/34* (2014.12); *H01L 31/02013* (2013.01); *H02S 40/36* (2014.12); *Y02E 10/50* (2013.01)

(58) Field of Classification Search
CPC ................................ H02S 40/34; H02S 40/36
(Continued)

(56) References Cited

U.S. PATENT DOCUMENTS 3,837,924 A    9/1974 Baron
4,542,258 A    9/1985 Francis et al.
(Continued)

FOREIGN PATENT DOCUMENTS

CN    1347181 A    5/2002
CN    102017180 B    1/2013
(Continued)

OTHER PUBLICATIONS

Yuncong Jiang, Jaber A. Abu Qahouq, and Mohamed Orabi, "PV Solar System with Series Output Connection and MPPT control", IEEE Xplore, 2013.
(Continued)

*Primary Examiner* — Eli S Mekhlin
*Assistant Examiner* — Kourtney R S Carlson
(74) *Attorney, Agent, or Firm* — Maschoff Brennan

(57) ABSTRACT

An expandable photovoltaic submodule comprises an adapter. The adapter comprises: an upper level port, wherein the upper level port comprises a front-positive terminal, a front-negative terminal, a first rear-positive terminal, and a first rear-negative terminal; a lower level port, wherein the lower level port comprises a second rear-positive terminal and a second rear-negative terminal; a first solar cell port, wherein the first solar cell port comprises a cell positive terminal and a cell negative terminal; and a plurality of potential lines coupled to the upper level port, the lower level port, and the first solar cell port, wherein the plurality of potential lines are adapted to series or parallel connections of at least two levels.

2 Claims, 15 Drawing Sheets

(58) Field of Classification Search
USPC .................................................. 136/242–265
See application file for complete search history.

(56) References Cited

U.S. PATENT DOCUMENTS

| | | | |
|---|---|---|---|
| 6,870,087 | B1 | 3/2005 | Gallagher |
| 8,859,881 | B2 | 10/2014 | Suzuki |
| 8,872,083 | B2 | 10/2014 | Cherukupalli |
| 8,970,065 | B2 | 3/2015 | Thompson |
| 9,048,358 | B2 | 6/2015 | Reese et al. |
| 9,153,721 | B1 | 10/2015 | Tourino |
| 9,287,418 | B2 | 3/2016 | Nirantare et al. |
| 9,391,223 | B2 | 7/2016 | Langmaid et al. |
| 2002/0038667 | A1 | 4/2002 | Kondo et al. |
| 2006/0213548 | A1 | 9/2006 | Bachrach et al. |
| 2009/0255565 | A1 | 10/2009 | Britt et al. |
| 2012/0152325 | A1 | 6/2012 | Podkin et al. |
| 2015/0311371 | A1* | 10/2015 | Krishnamoorthy ..... H02S 40/36 136/256 |

FOREIGN PATENT DOCUMENTS

| | | |
|---|---|---|
| CN | 103262355 A | 8/2013 |
| CN | 203788237 U | 8/2014 |
| TW | 200832856 A | 8/2008 |
| TW | 200903886 A | 1/2009 |
| TW | M420886 A | 1/2009 |
| TW | 201014012 A | 4/2010 |
| TW | I419346 B | 12/2013 |
| TW | M516535 U | 2/2016 |
| TW | I533008 B | 5/2016 |
| WO | 2016049710 A1 | 4/2016 |

OTHER PUBLICATIONS

R. E. Hanitsch, Detlef Schulz and Udo Siegfried, "Shading Effects on Output Power of Grid Connected Photovoltaic Generator Systems", Rev. Energ. Ren. : Power Engineering (2001) 93-99.

Geoffrey R. Walker and Paul C. Sernia, "Cascaded DC-DC Converter Connection of Photovoltaic Modules", IEEE Transacations on Power Electronics, vol. 19, No. 4, (2004) 1130-1139.

Ramaprabha and Badrilal Mathur, "Effect of Shading on Series and Parallel Connected Solar PV Modules", Modern Applied Science, vol. 3, No. 10, (2009) , 32-41.

Samir Kouro, Bin Wu, Alvaro Moya, Elena Villanueva, Pablo Correa, and José Rodríguez,"Control of a cascaded H-bridge multilevel converter for grid connection of photovoltaic systems", Industrial Electronics, 2009. IECON '09. 35th Annual Conference of IEEE, 3976-3982.

\* cited by examiner

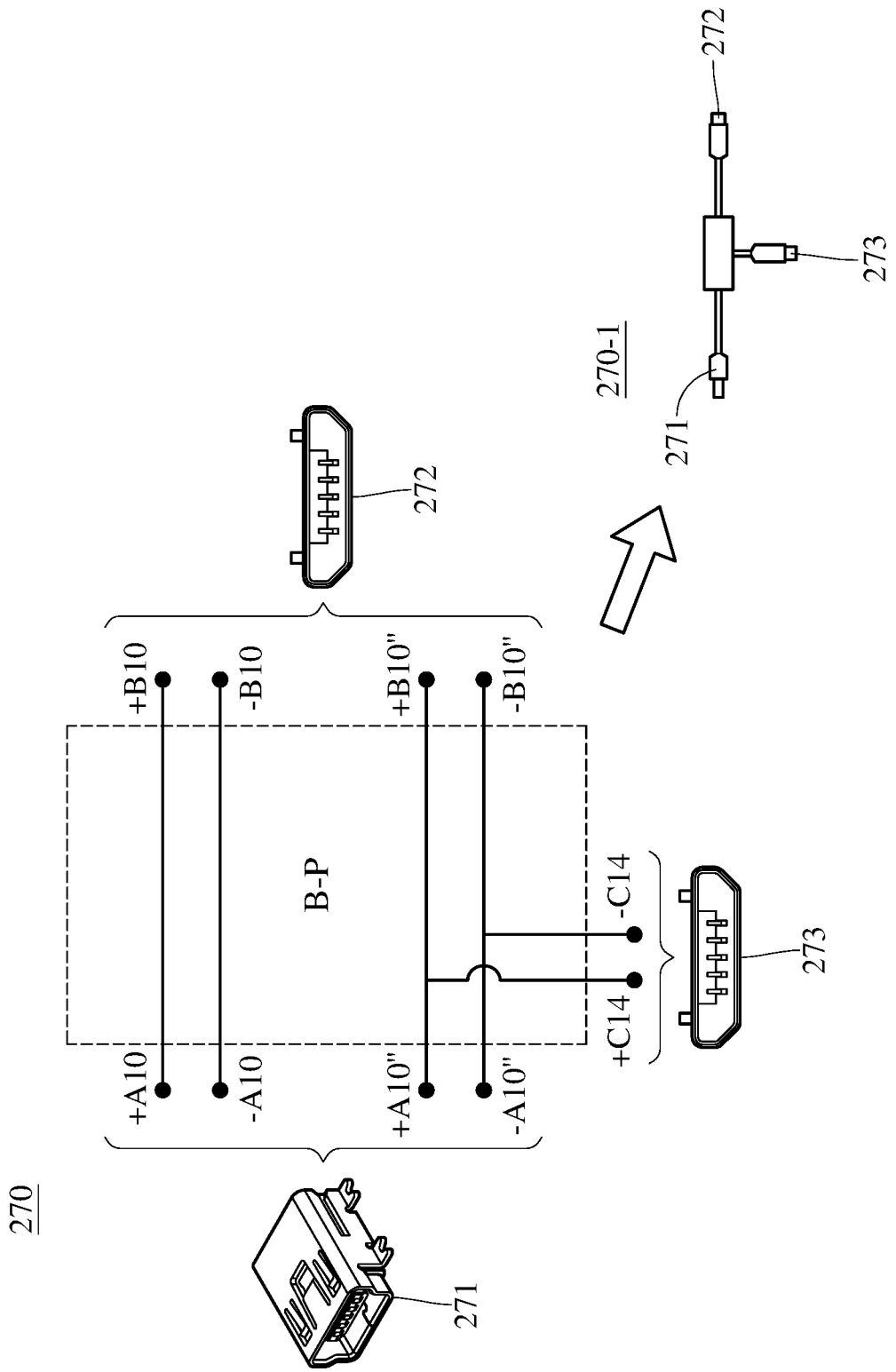

EXPANDABLE PHOTOVOLTAIC SUBMODULES

CROSS REFERENCE TO RELATED APPLICATION

This application claims the priority benefits of Taiwan application No. 105142567, entitled "EXPANDABLE PHOTOVOLTAIC SUBMODULES", and filed in the Taiwan Intellectual Property Office on Dec. 21, 2016. The entirety of which is incorporated by reference herein.

TECHNICAL FIELD

The disclosure relates to an expandable photovoltaic submodules and its structure.

BACKGROUND

Manufacturing for photovoltaic modules may be limited to arrangement of ribbons/wires or soldering. The ribbons of series/parallel connections for solar cells are fixed. If parts of solar cells in a photovoltaic module are damaged, the whole photovoltaic module may not work anymore. The weight and the area of a single photovoltaic module are too heavy and too large for transporting and stowing, which is detrimental to the photovoltaic applications such as Pico Solar Systems, Solar Home Systems (SHS), and other lightweight miniature consumer products. A miniaturized photovoltaic submodule with external electrical interconnections may be a way to solve the above mentioned problems. However, the processes of directly soldering series and/or parallel connections by external wires are not simple. In addition, the external interconnected miniaturized submodules may not be dismantled or stowed again.

SUMMARY

The present disclosure provides an expandable photovoltaic submodule. The expandable photovoltaic submodule comprises an adapter. The adapter comprises: an upper level port, wherein the upper level port comprises a front-positive terminal, a front-negative terminal, a first rear-positive terminal, and a first rear-negative terminal; a lower level port, wherein the lower level port comprises a second rear-positive terminal and a second rear-negative terminal; a first solar cell port, wherein the first solar cell port comprises a cell positive terminal and a cell negative terminal; and a plurality of potential lines coupled to the upper level port, the lower level port, and the first solar cell port, wherein the plurality of potential lines are adapted to series or parallel connections of at least two levels.

The present disclosure provides an expandable photovoltaic submodule. The expandable photovoltaic submodule comprises a solar cell; and an adapter coupled to the solar cell. The adapter comprises: an upper level port, wherein the upper level port comprises a front-positive terminal, a front-negative terminal, a first rear-positive terminal, and a first rear-negative terminal; a lower level port, wherein the lower level port comprises a second rear-positive terminal and a second rear-negative terminal; and a plurality of potential lines coupled to the upper level port, the lower level port, and the solar cell, wherein the plurality of potential lines are adapted to series or parallel connections of at least two levels.

The present disclosure provides an expandable photovoltaic submodule. The expandable photovoltaic submodule comprises a first solar cell; a second solar cell; and an adapter coupled to the first solar cell and the second solar cell. The adapter comprises: an upper level port, wherein the upper level port comprises a front-positive terminal, a front-negative terminal, a first rear-positive terminal, and a first rear-negative terminal; a lower level port, wherein the lower level port comprises a second rear-positive terminal and a second rear-negative terminal; and a plurality of potential lines coupled to the upper level port, the lower level port, the first solar cell, and the second solar cell, wherein the plurality of potential lines are adapted to series or parallel connections of at least two levels.

The foregoing will become better understood from a careful reading of a detailed description provided herein below with appropriate reference to the accompanying drawings.

BRIEF DESCRIPTION OF THE DRAWINGS

FIG. 10B is a diagram illustrating an adapter in accordance with an embodiment of the present disclosure.

DETAILED DESCRIPTION OF DISCLOSED EMBODIMENTS

The present disclosure provides an expandable photovoltaic submodule. According to requirements, a plurality of solar cells/submodules may be combined as a complete photovoltaic module by using series and/or parallel connections. By using different types of adapters having integrated potential lines, a plurality of independent solar cells/submodules may be electrically and structurally connected. For example, a plurality of solar cells/submodules are connected as a unit in series. Those units then are connected in parallel. For another example, a plurality of solar cells/submodules are connected as a unit in parallel. Those units then are connected in series. For another example, a hybrid connection having series and parallel connections may also be performed. In practice, the adapters have considerable flexibility and convenience.

Figure 1:
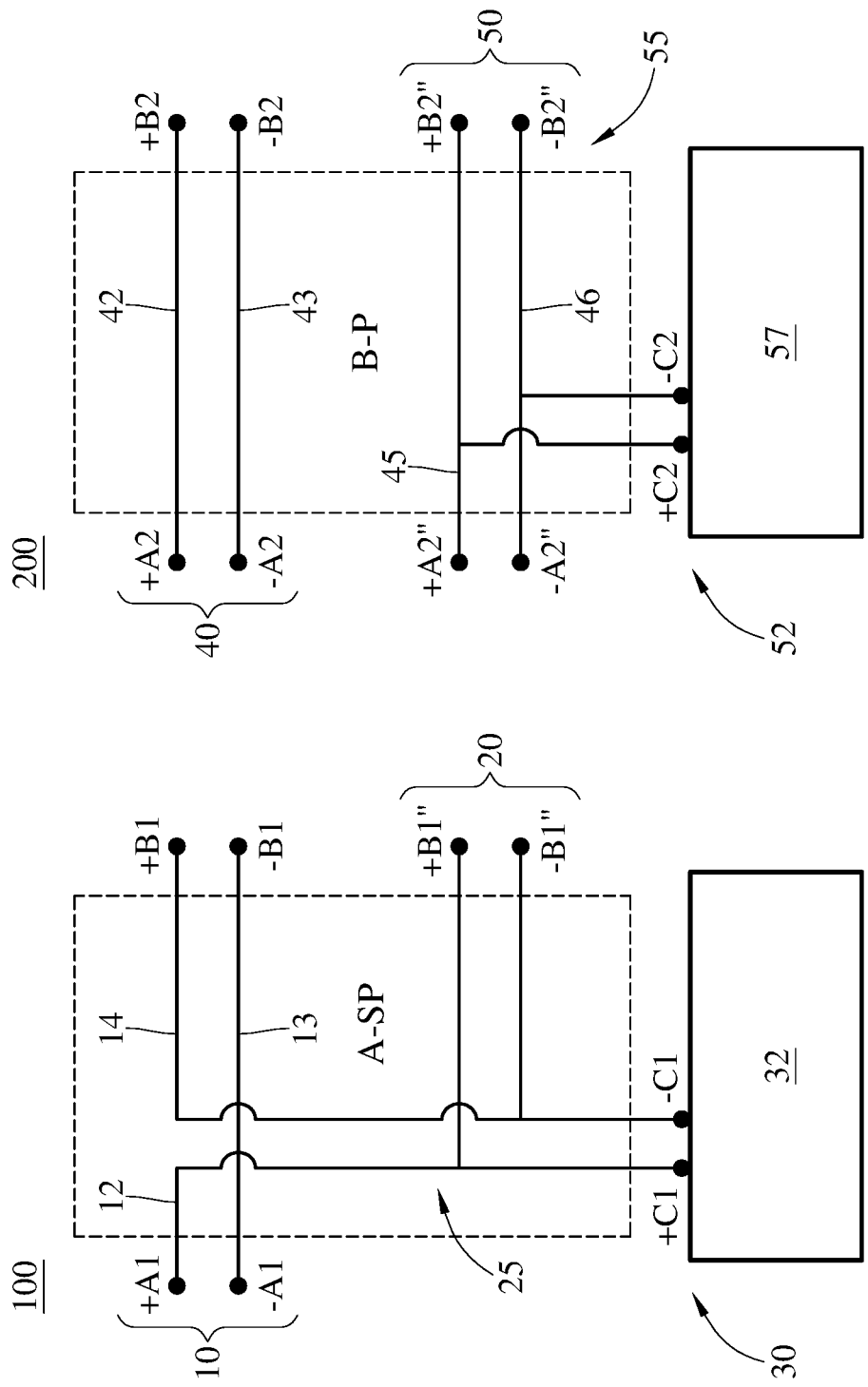
FIG. 1 is a diagram illustrating adapters in accordance with embodiments of the present disclosure.

FIG. 1 is a diagram illustrating adapters 100 and 200 in accordance with an embodiment of the present disclosure. In an embodiment, the adapter 100 is applicable to an expandable photovoltaic submodule or solar cells. The adapter 100 is also called as an A-SP type adapter. The adapter 100 comprises: an upper level port 10, wherein the upper level port 10 comprises a front-positive terminal +A1, a front-negative terminal −A1, a rear-positive terminal +B1, and a rear-negative terminal −B1; a lower level port 20, wherein the lower level port 20 comprises a rear-positive terminal +B1" and a rear-negative terminal −B1"; a solar cell port 30, wherein the solar cell port 30 comprises a cell positive terminal +C1 and a cell negative terminal −C1; and a plurality of potential lines 25 coupled to the upper level port 10, the lower level port 20, and the solar cell port 30, wherein the plurality of potential lines 25 are adapted to series or parallel connections of at least two levels.

In an embodiment, the potential lines 25 further comprises a first potential line 12. The first potential line 12 is connected to the front-positive terminal +A1 of the upper level port 10, the rear-positive terminal +B1" of the lower level port 20, and the cell positive terminal +C1.

In an embodiment, the potential lines 25 further comprises a second potential line 13. The second potential line 13 is connected to the front-negative terminal −A1 of the upper level port 10 and the rear-negative terminal −B1 of the upper level port 10.

In an embodiment, the potential lines 25 further comprises a third potential line 14. The third potential line 14 is connected to the rear-positive terminal +B1 of the upper level port 10, the rear-negative terminal −B1" of the lower level port 20, and the cell negative terminal −C1.

In practice, the front-positive terminal +A1 and the front-negative terminal −A1 of the upper level port 10 will connect to another adapters or circuits of a previous stage. The rear-positive terminal +B1, the rear-negative terminal −B1 (the upper level port 10), the rear-positive terminal +B1", and the rear-negative terminal −B1" (the lower level port 20) will connect to adapters or circuits of a post stage. The cell positive terminal +C1 and the cell negative terminal −C1 of the solar cell port 30 connect to a solar cell 32 or a submodule.

In an embodiment, the adapter 200 is applicable to an expandable photovoltaic submodule or solar cells. The adapter 200 is also called as a B-P type adapter. The adapter 200 comprises: an upper level port 40, wherein the upper level port 40 comprises a front-positive terminal +A2, a front-negative terminal −A2, a rear-positive terminal +B2, and a rear-negative terminal −B2; a lower level port 50, wherein the lower level port 50 comprises a rear-positive terminal +B2" and a rear-negative terminal −B2"; a solar cell port 52, wherein the solar cell port 52 comprises a cell positive terminal +C2 and a cell negative terminal −C2; and a plurality of potential lines 55 coupled to the upper level port 40, the lower level port 50, and the solar cell port 52, wherein the plurality of potential lines 55 are adapted to series or parallel connections of at least two levels.

In an embodiment, the potential lines 55 further comprises a first potential line 42. The first potential line 42 is connected to the front-positive terminal +A2 of the upper level port 40 and the rear-positive terminal +B2 of the upper level port 40.

In an embodiment, the potential lines 55 further comprises a second potential line 43. The second potential line 43 is connected to the front-negative terminal −A2 of the upper level port 40 and the rear-negative terminal −B2 of the upper level port 40.

In an embodiment, the lower level port 50 further comprises a front-positive terminal +A2"; and a front-negative terminal −A2". The potential lines 55 further comprises a third potential line 45. The third potential line 45 is connected to the front-positive terminal +A2" of the lower level port 50, the rear-positive terminal +B2" of the lower level port 50, and the cell positive terminal +C2.

In an embodiment, the potential lines 55 further comprises and a fourth potential line 46. The fourth potential line 46 is connected to the front-negative terminal −A2" of the lower level port 50, the rear-negative terminal −B2" of the lower level port 50, and the cell negative terminal −C2. In an embodiment, the cell positive terminal +C2 and the cell negative terminal −C2 of the solar cell port 52 connect to a solar cell 57 or a submodule.

Figure 2:
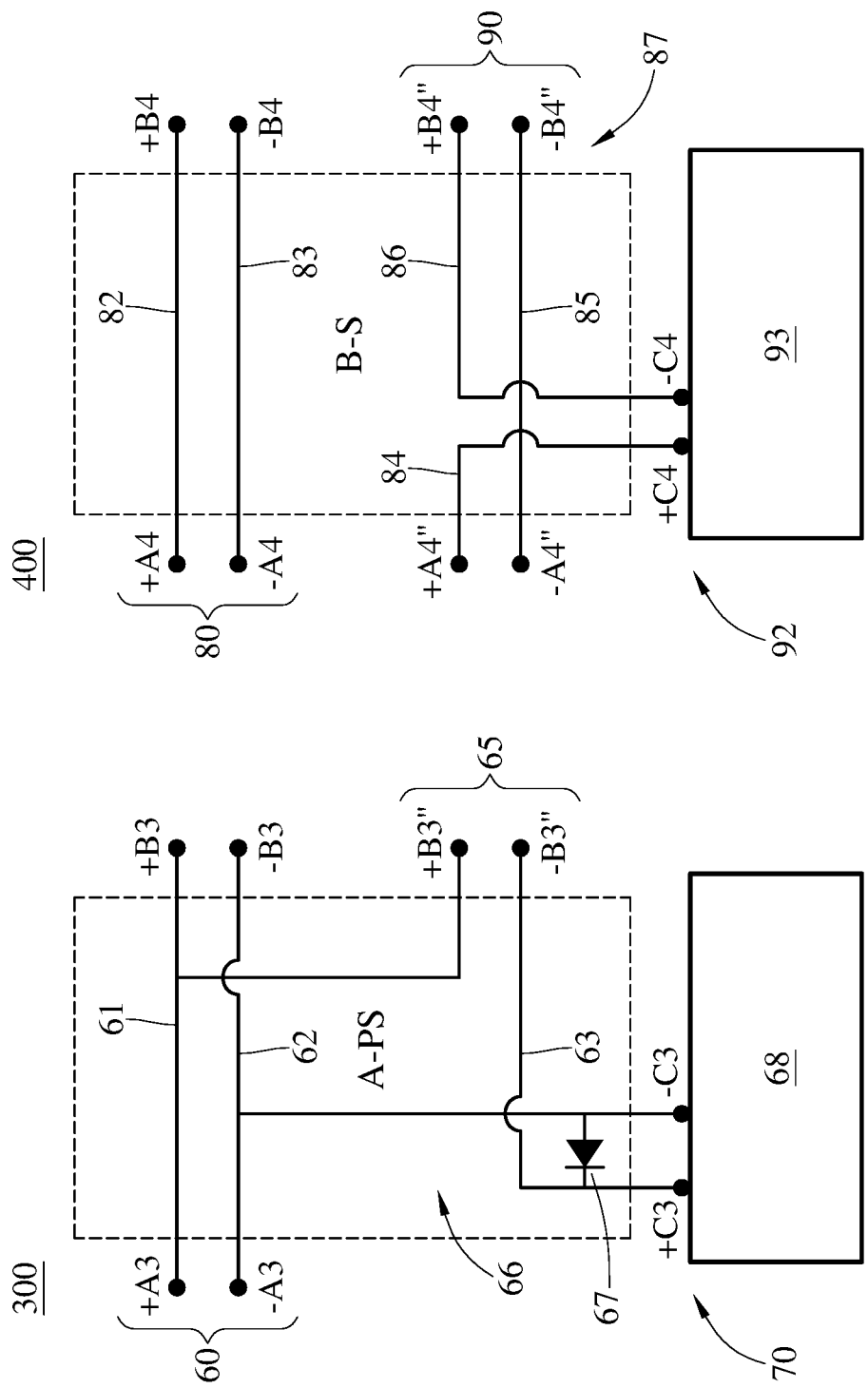
FIG. 2 is a diagram illustrating adapters in accordance with embodiments of the present disclosure.

FIG. 2 is a diagram illustrating adapters 300 and 400 in accordance with embodiments of the present disclosure. In an embodiment, the adapter 300 is applicable to an expandable photovoltaic submodule or solar cells. The adapter 300 is also called as an A-PS type adapter. The adapter 300 comprises: an upper level port 60, wherein the upper level port 60 comprises a front-positive terminal +A3, a front-negative terminal −A3, a rear-positive terminal +B3, and a rear-negative terminal −B3; a lower level port 65, wherein the lower level port 65 comprises a rear-positive terminal +B3" and a rear-negative terminal −B3"; a solar cell port 70, wherein the solar cell port 70 comprises a cell positive terminal +C3 and a cell negative terminal −C3; and a plurality of potential lines 66 coupled to the upper level port 60, the lower level port 65, and the solar cell port 70, wherein the plurality of potential lines 66 are adapted to series or parallel connections of at least two levels.

In an embodiment, the potential lines 66 further comprises a first potential line 61. The first potential line 61 is connected to the front-positive terminal +A3 of the upper level port 60, the rear-positive terminal +B3 of the upper level port 60, and the rear-positive terminal +B3" of the lower level port 65.

In an embodiment, the potential lines 66 further comprises a second potential line 62. The second potential line 62 is connected to the front-negative terminal −A3 of the upper level port 60, the rear-negative terminal −B3 of the upper level port 60, and the cell negative terminal −C3.

In an embodiment, the potential lines 66 further comprises a third potential line 63. The third potential line 63 is connected to the rear-negative terminal −B3" of the lower level port 65 and the cell positive terminal +C3.

In an embodiment, the adapter 300 comprises a by-pass diode 67 (also referred to as a protection diode). The by-pass diode 67 is utilized to protect solar cells from being broken down by the reverse voltage or the transient current. The by-pass diode 67 is located between the second potential line 62 and the third potential line 63. An anode of the by-pass diode 67 connects to the second potential line 62. A cathode of the by-pass diode 67 connects to the third potential line 63. In an embodiment, the cell positive terminal +C3 and the cell negative terminal −C3 of the solar cell port 70 connect to a solar cell 68 or a submodule.

In an embodiment, the adapter 400 is applicable to an expandable photovoltaic submodule or solar cells. The adapter 400 is also called as a B-S type adapter. The adapter 400 comprises: an upper level port 80, wherein the upper level port 80 comprises a front-positive terminal +A4, a front-negative terminal −A4, a rear-positive terminal +B4, and a rear-negative terminal −B4; a lower level port 90, wherein the lower level port 90 comprises a rear-positive terminal +B4" and a rear-negative terminal −B4"; a solar cell port 92, wherein the solar cell port 92 comprises a cell positive terminal +C4 and a cell negative terminal −C4; and a plurality of potential lines 87 coupled to the upper level port 80, the lower level port 90, and the solar cell port 92, wherein the plurality of potential lines 87 are adapted to series or parallel connections of at least two levels.

In an embodiment, the potential lines 87 further comprises a first potential line 82. The first potential line 82 is connected to the front-positive terminal +A4 of the upper level port 80 and the rear-positive terminal +B4 of the upper level port 80.

In an embodiment, the potential lines 87 further comprises a second potential line 83. The second potential line 83 is connected to the front-negative terminal −A4 of the upper level port 80 and the rear-negative terminal −B4 of the upper level port 80.

In an embodiment, the lower level port 90 further comprises a front-positive terminal +A4"; and a front-negative terminal −A4". The potential lines 87 further comprises a third potential line 84. The third potential line 84 is connected to the front-positive terminal +A4" of the lower level port 90 and the cell positive terminal +C4.

In an embodiment, the potential lines 87 further comprises a fourth potential line 85. The fourth potential line 85 is connected to the front-negative terminal −A4" of the lower level port 90 and the rear-negative terminal −B4" of the lower level port 90.

In an embodiment, the potential lines 87 further comprises a fifth potential line 86. The fifth potential line 86 is connected to the rear-positive terminal +B4" of the lower level port 90 and the cell negative terminal −C4. In an embodiment, the cell positive terminal +C4 and the cell negative terminal −C4 of the solar cell port 92 connect to a solar cell 93 or a submodule.

Figure 3A:
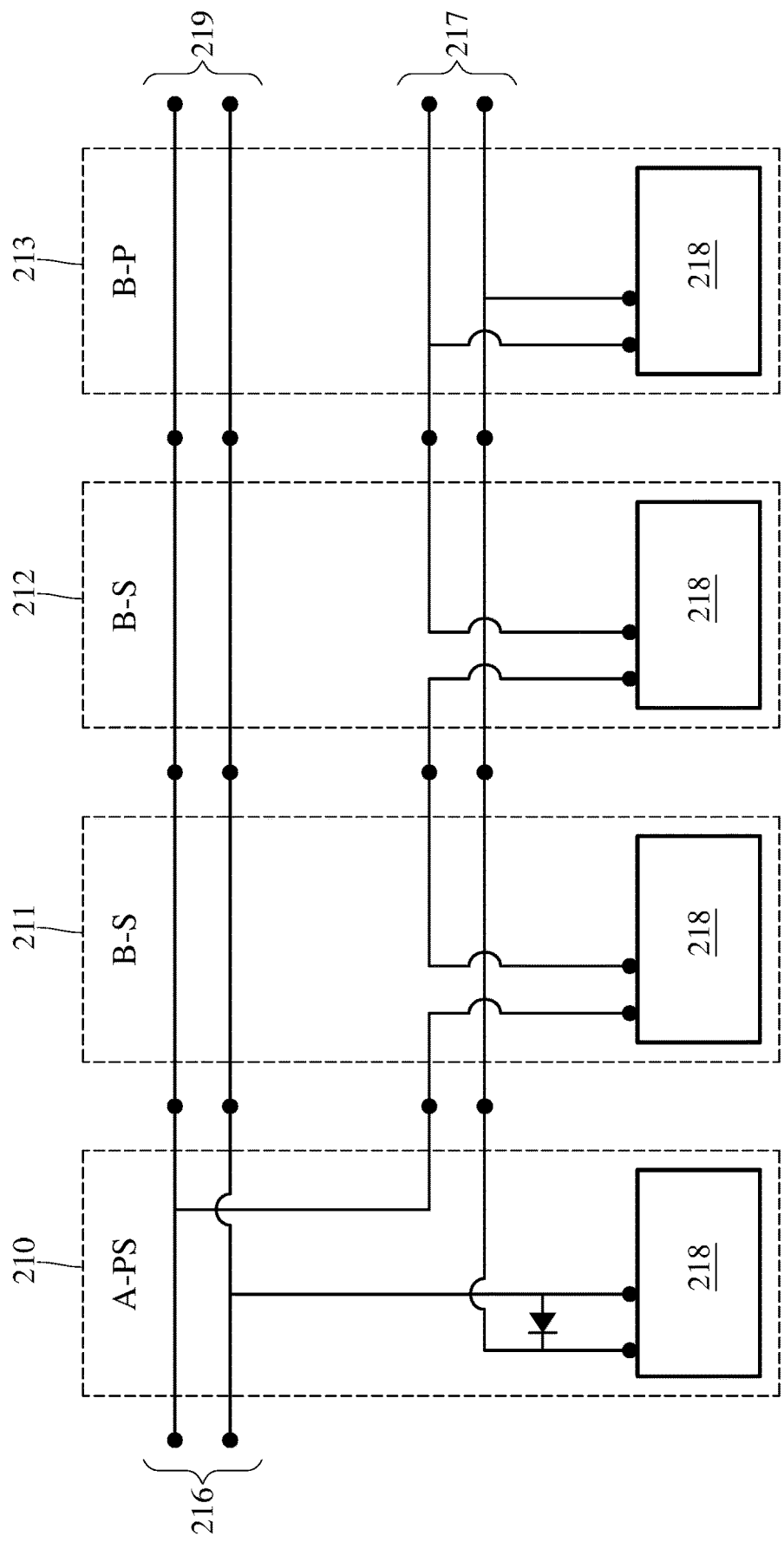
FIG. 3A is a diagram illustrating photovoltaic submodules in accordance with an embodiment of the present disclosure.

FIG. 3A is a diagram illustrating photovoltaic submodules in accordance with an embodiment of the present disclosure. In the embodiment, there are photovoltaic submodules 210, 211, 212, and 213 in FIG. 3A. The photovoltaic submodule 210 is referred to as a combination of an A-PS type adapter and a solar cell 218. The photovoltaic submodule 211 or 212 is referred to as a combination of a B-S type adapter and a solar cell 218. The photovoltaic submodule 213 is referred to as a combination of a B-P type adapter and a solar cell 218. Front-upper-level ports 216 connect to rear-upper-level ports 219 in parallel. Lower level ports 217 respectively connect to the solar cells 218 in series. As such, two levels of potential lines are combined so as to expand output power of solar cells 218. The A-PS type adapter of the photovoltaic submodule 210 makes the lower level ports 217 to connect in series. The A-PS type adapter makes the rear-upper-level ports 219 to connect in parallel. On the other hand, an A-SP type adapter makes upper level ports to connect in series. The A-SP type adapter makes lower level ports to connect in parallel.

Figure 3B:
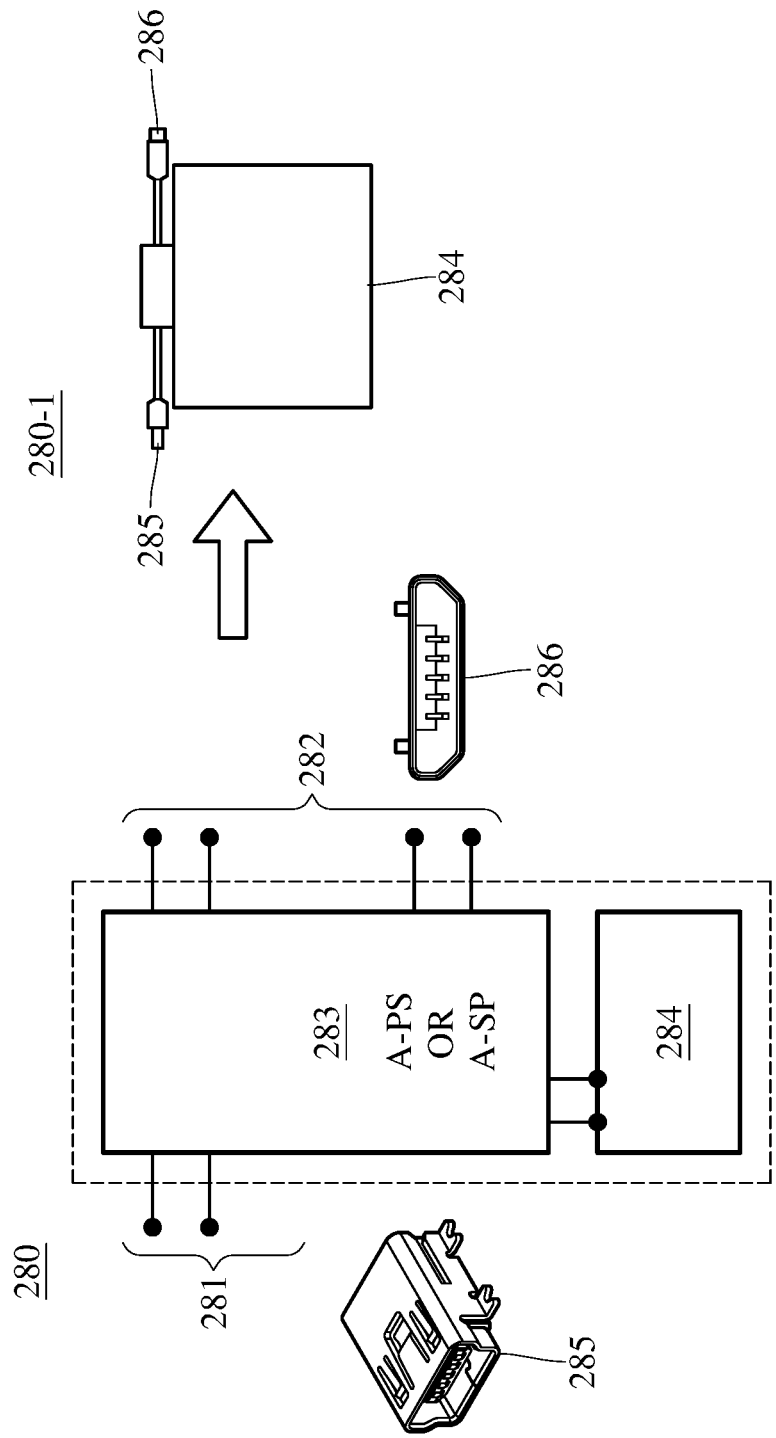
FIG. 3B is a diagram illustrating a photovoltaic submodule in accordance with an embodiment of the present disclosure.

FIG. 3B is a diagram illustrating a photovoltaic submodule 280 in accordance with an embodiment of the present disclosure. In the embodiment, the photovoltaic submodule 280 comprises an adapter 283 and a solar cell 284. The adapter 283 may be an A-PS type adapter (such as the adapter 300) or an A-SP adapter (such as the adapter 100). The adapter 283 has a front-upper-level port 281, wherein the front-upper-level port 281 is integrated as a port 285. The port 285 is a type of Micro-B 5P universal serial bus (USB) connector, wherein the port 285 is a female end. The adapter 283 has a rear-upper-lower-level port 282. The rear-upper-lower-level port 282 is integrated as a port 286. The port 286 is a type of Micro-B 5P universal serial bus (USB) connector, wherein the port 286 is a male end. A schematic view of the outward appearance of the photovoltaic submodule 280 is shown as a photovoltaic submodule 280-1.

Figure 3C:
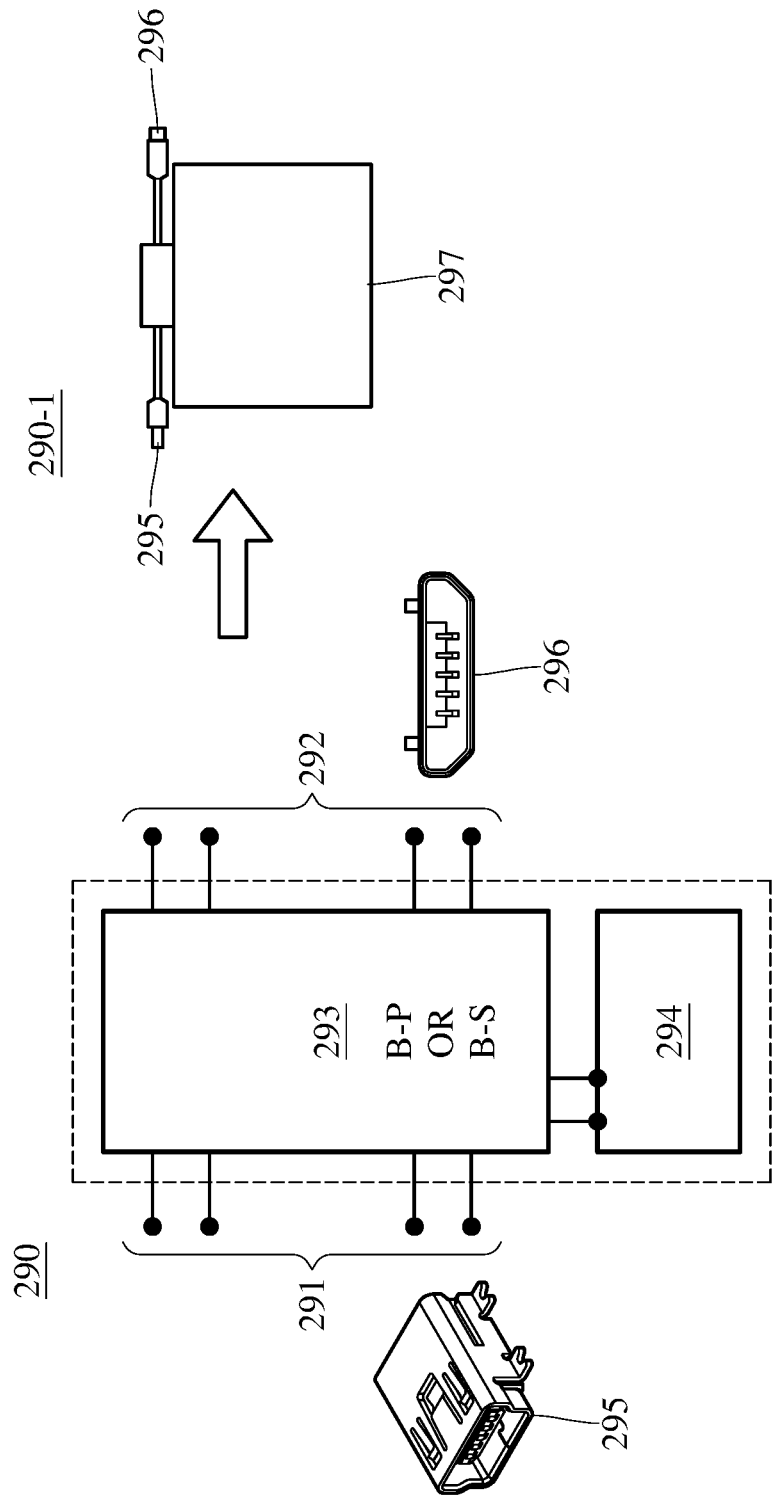
FIG. 3C is a diagram illustrating a photovoltaic submodule in accordance with an embodiment of the present disclosure.

FIG. 3C is a diagram illustrating a photovoltaic submodule 290 in accordance with an embodiment of the present disclosure. In the embodiment, the photovoltaic submodule 290 comprises an adapter 293 and a solar cell 294. The adapter 293 may be a B-P type adapter (such as the adapter 200) or a B-S type adapter (such as the adapter 400). The adapter 283 has a front-upper-lower-level port 291, wherein the front-upper-lower-level port 291 is integrated as a port 295. The port 295 is a type of Micro-B 5P universal serial bus (USB) connector, wherein the port 295 is a female end. The adapter 293 has a rear-upper-lower-level port 292. The rear-upper-lower-level port 292 is integrated as a port 296. The port 296 is a type of Micro-B 5P universal serial bus (USB) connector, wherein the port 296 is a male end. A schematic view of the outward appearance of the photovoltaic submodule 290 is shown as a photovoltaic submodule 290-1.

Figure 4:
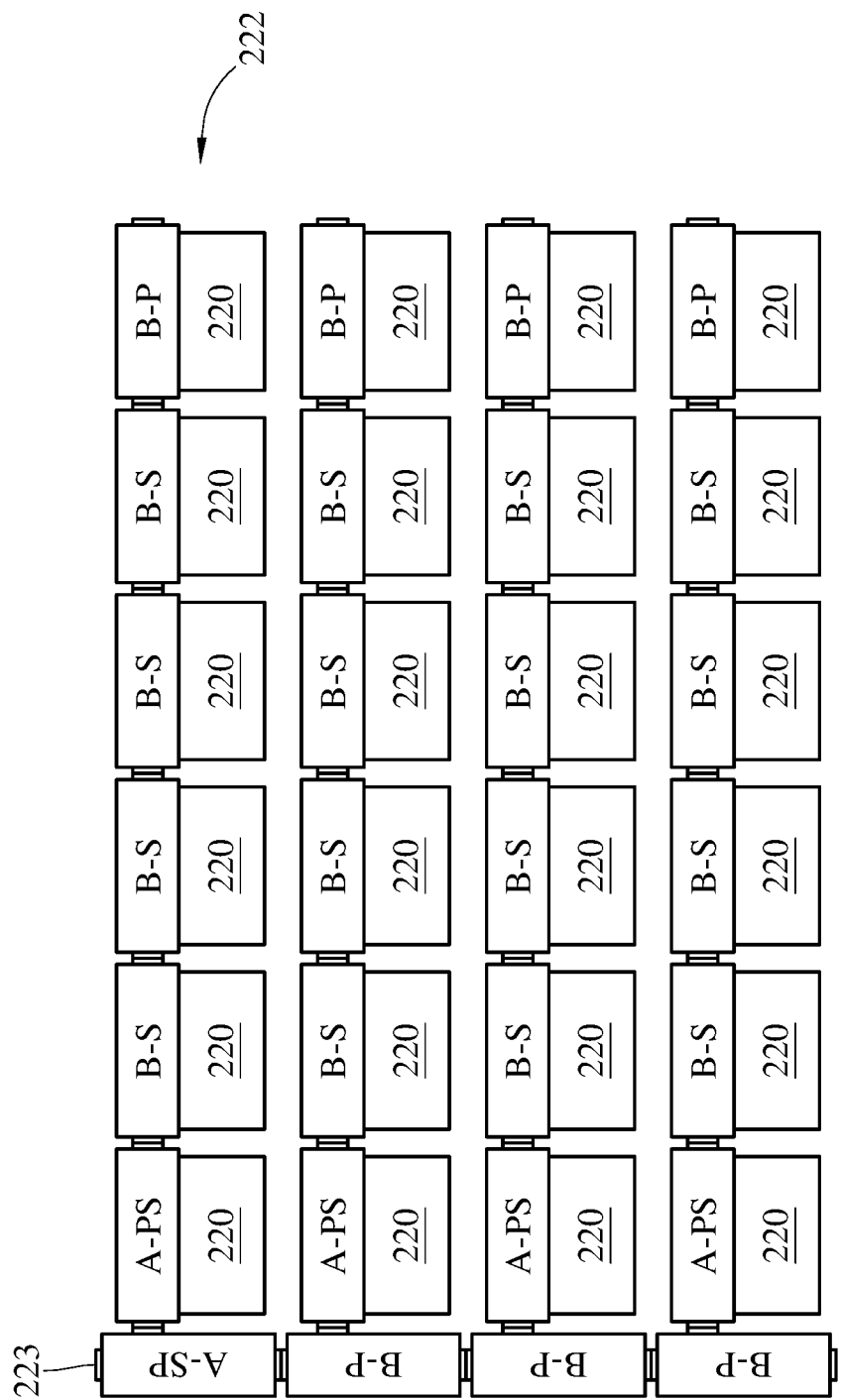
FIG. 4 is a diagram illustrating assembling of solar cells by using adapters in accordance with an embodiment of the present disclosure.

FIG. 4 is a diagram illustrating assembling of solar cells by using adapters in accordance with an embodiment of the present disclosure. In the embodiment, each solar cell 220 has an output voltage of 0.5 volts (V), an output current of 2 amperes (A), and an output power of 1 watt (W). Six solar cells 220 are connected in series as a row 222. Each row 222 has an A-PS type adapter, four B-S type adapters, and a B-P type adapter. Four rows 222 are connected in parallel by using an A-SP type adapter and three B-P type adapters. The A-SP type adapter has an output terminal 223. The whole solar cell module has an output voltage of 3.0 volts (V) and an output current of 8.0 amperes (A), and an output power of 24 watts (W).

Figure 5:
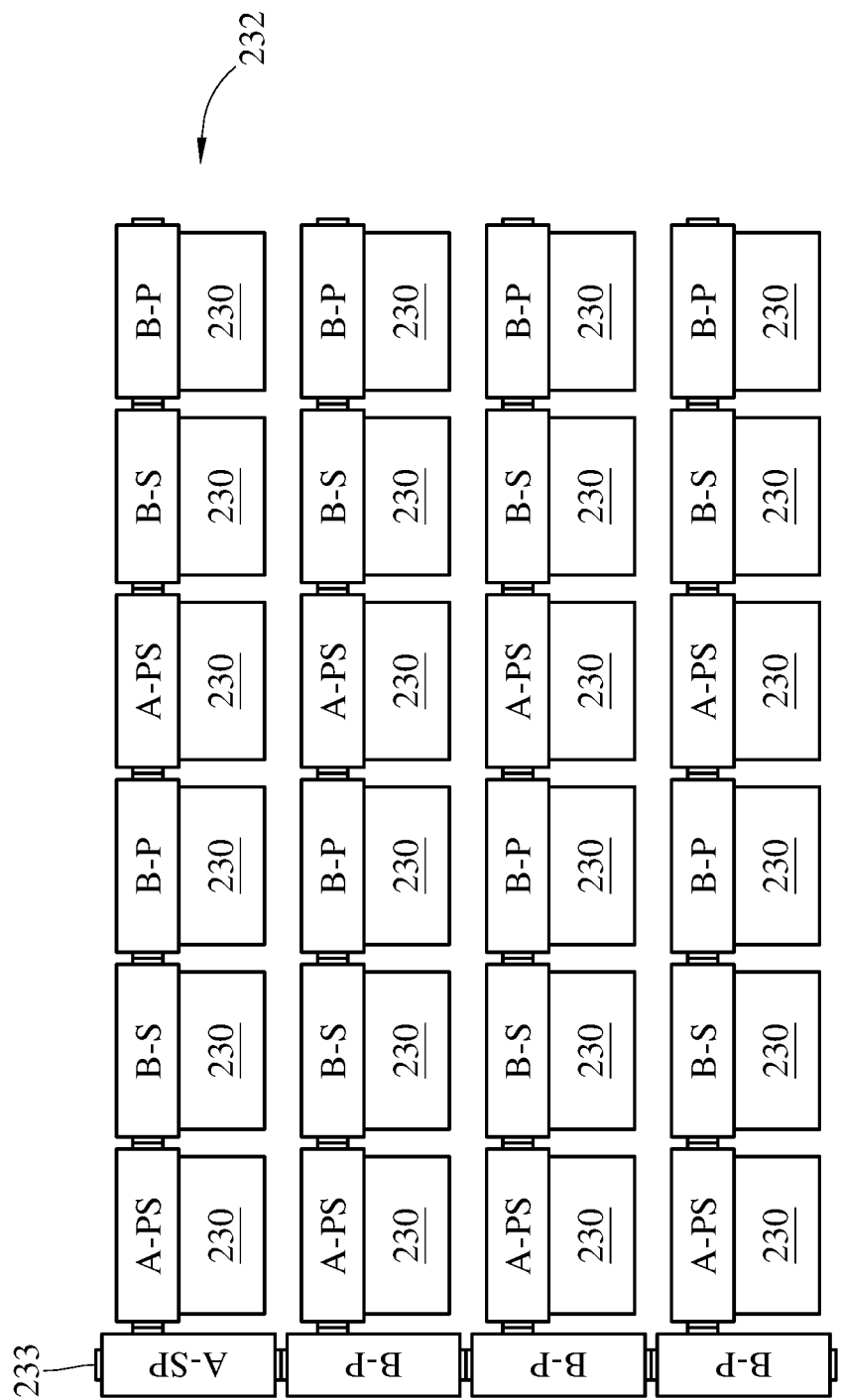
FIG. 5 is a diagram illustrating assembling of solar cells by using adapters in accordance with another embodiment of the present disclosure.

FIG. 5 is a diagram illustrating assembling of solar cells by using adapters in accordance with another embodiment of the present disclosure. In the embodiment, each solar cell 230 has an output voltage of 0.5 volts (V), an output current of 2 amperes (A), and an output power of 1 watt (W). Each row 232 comprises a unit having an A-PS type adapter, a B-S type adapter, and a B-P type adapter in series connection. Later, two units are connected in parallel. Four rows 232 are connected in parallel by using an A-SP type adapter and three B-P type adapters. The A-SP type adapter has an output terminal 233. The whole solar cell module has an output voltage of 1.5 volts (V) and an output current of 16.0 amperes (A), and an output power of 24 watts (W).

Figure 6:
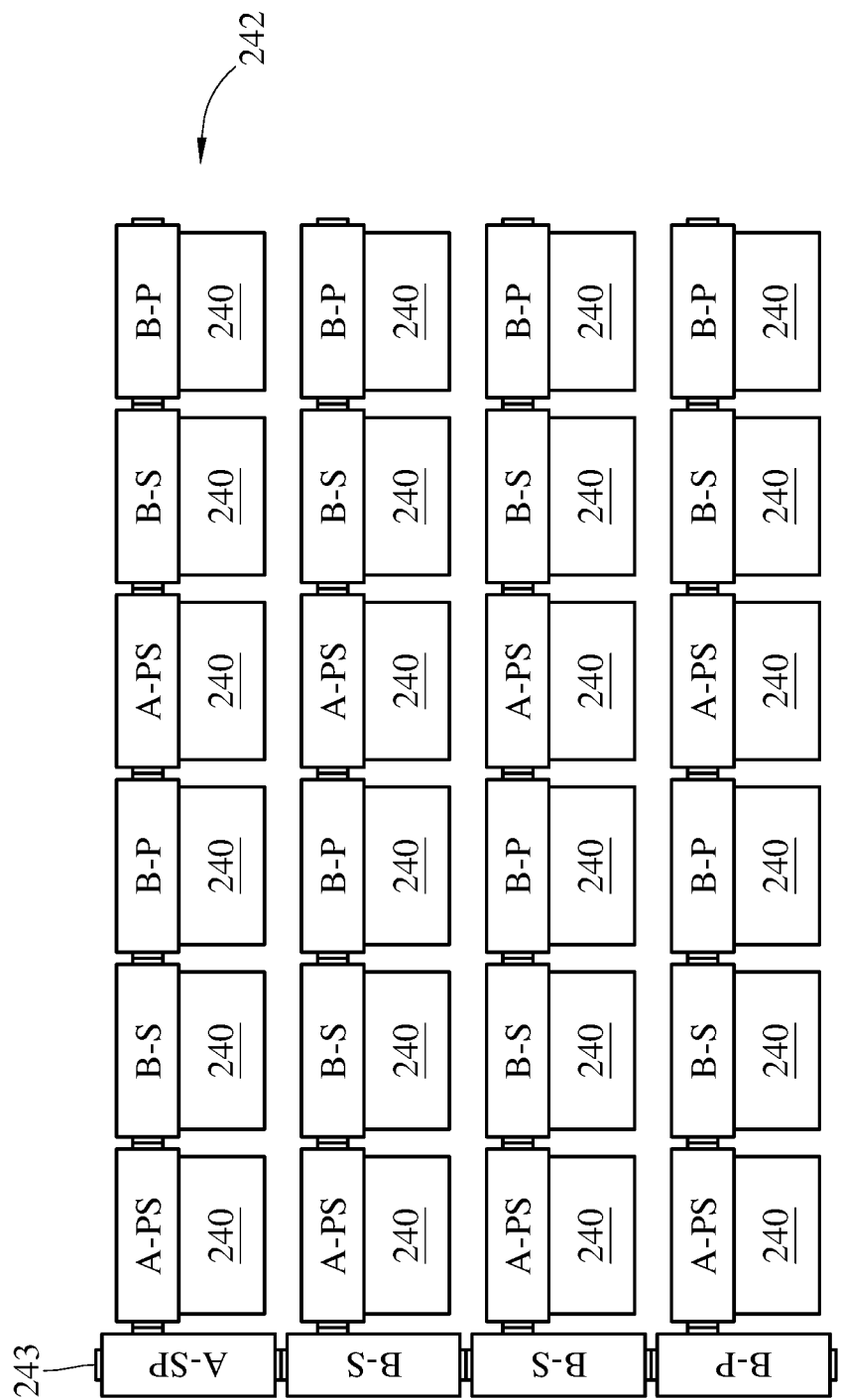
FIG. 6 is a diagram illustrating assembling of solar cells by using adapters in accordance with yet another embodiment of the present disclosure.

FIG. 6 is a diagram illustrating assembling of solar cells by using adapters in accordance with yet another embodiment of the present disclosure. In the embodiment, each solar cell 240 has an output voltage of 0.5 volts (V), an output current of 2 amperes (A), and an output power of 1 watt (W). Each row 242 comprises a unit having an A-PS type adapter, a B-S type adapter, and a B-P type adapter in series connection. Later, two units are connected in parallel. Four rows 242 are connected in series by using an A-SP type adapter and two B-S type adapters, and a B-P type adapter.

The A-SP type adapter has an output terminal 243. The whole solar cell module has an output voltage of 6.0 volts (V) and an output current of 4.0 amperes (A), and an output power of 24 watts (W).

Figure 7:
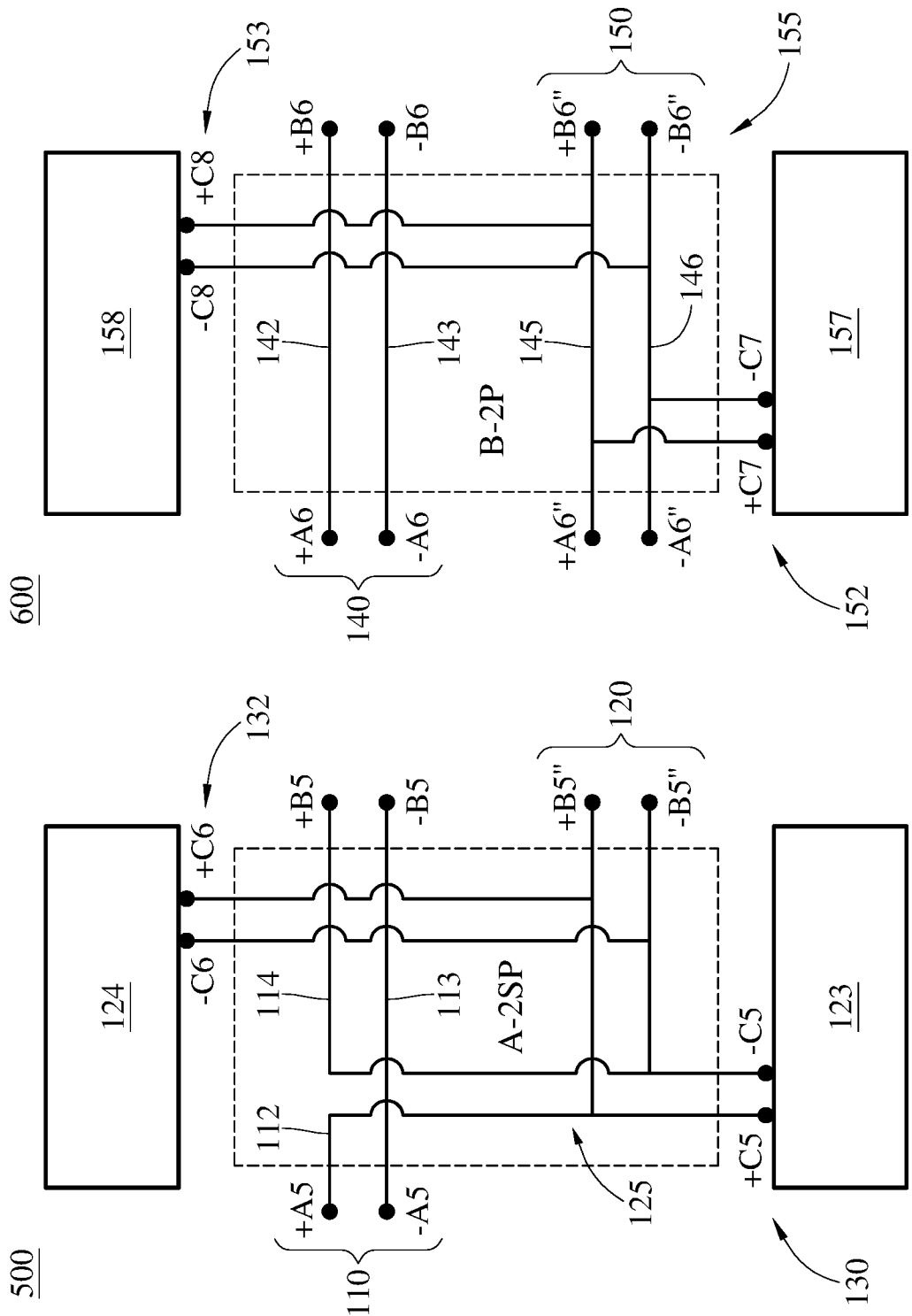
FIG. 7 is a diagram illustrating adapters in accordance with embodiments of the present disclosure.

FIG. 7 is a diagram illustrating adapters 500 and 600 in accordance with an embodiment of the present disclosure. In an embodiment, the adapter 500 is applicable to an expandable photovoltaic submodule or solar cells. The adapter 500 is also called as an A-2SP type adapter. The adapter 500 comprises: an upper level port 110, wherein the upper level port 110 comprises a front-positive terminal +A5, a front-negative terminal −A5, a rear-positive terminal +B5, and a rear-negative terminal −B5; a lower level port 120, wherein the lower level port 120 comprises a rear-positive terminal +B5" and a rear-negative terminal −B5"; a solar cell port 130, wherein the solar cell port 130 comprises a cell positive terminal +C5 and a cell negative terminal −C5; and a plurality of potential lines 125 coupled to the upper level port 110, the lower level port 120, and the solar cell port 130, wherein the plurality of potential lines 125 are adapted to series or parallel connections of at least two levels.

In an embodiment, the adapter 500 further comprises a solar cell port 132, wherein the solar cell port 132 comprises a cell positive terminal +C6 and a cell negative terminal −C6. The potential lines 125 further comprises a first potential line 112. The first potential line 112 is connected to the front-positive terminal +A5 of the upper level port 110, the rear-positive terminal +B5" of the lower level port 120, the cell positive terminal +C5, and the cell positive terminal +C6. The potential lines 125 further comprises a second potential line 113. The second potential line 113 is connected to the front-negative terminal −A5 of the upper level port 110 and the rear-negative terminal −B5 of the upper level port 110. The potential lines 125 further comprises a third potential line 114. The third potential line 114 is connected to the rear-positive terminal +B5 of the upper level port 110, the rear-negative terminal −B5" of the lower level port 120, the cell negative terminal −C5, and the cell negative terminal −C6. The cell positive terminal +C6 of the solar cell port 132 connects to the first potential line 112. The cell negative terminal −C6 of the solar cell port 132 connects to the third potential line 114. The adapter 500 is a double-side-type adapter (A-2SP type adapter). The solar cell port 130 connects to a solar cell 123 or a submodule, and the solar cell port 132 connects to a solar cell 124 or a submodule.

In an embodiment, the adapter 600 is applicable to an expandable photovoltaic submodule or solar cells. The adapter 600 is also called as a B-2P type adapter. The adapter 600 comprises: an upper level port 140, wherein the upper level port 140 comprises a front-positive terminal +A6, a front-negative terminal −A6, a rear-positive terminal +B6, and a rear-negative terminal −B6; a lower level port 150, wherein the lower level port 150 comprises a rear-positive terminal +B6" and a rear-negative terminal −B6"; a solar cell port 152, wherein the solar cell port 152 comprises a cell positive terminal +C7 and a cell negative terminal −C7; and a plurality of potential lines 155 coupled to the upper level port 140, the lower level port 150, and the solar cell port 152, wherein the plurality of potential lines 155 are adapted to series or parallel connections of at least two levels.

In an embodiment, the adapter 600 further comprises another solar cell port 153, wherein the solar cell port 153 comprises a cell positive terminal +C8 and a cell negative terminal −C8. In an embodiment, the potential lines 155 further comprises a first potential line 142. The first potential line 142 is connected to the front-positive terminal +A6 of the upper level port 140 and the rear-positive terminal +B6 of the upper level port 140. The potential lines 155 further comprises a second potential line 143. The second potential line 143 is connected to the front-negative terminal −A6 of the upper level port 140 and the rear-negative terminal −B6 of the upper level port 140. The lower level port 150 further comprises a front-positive terminal +A6"; and a front-negative terminal −A6". The potential lines 155 further comprises a third potential line 145. The third potential line 145 is connected to the front-positive terminal +A6" of the lower level port 150, the rear-positive terminal +B6" of the lower level port 150, the cell positive terminal +C7, and the cell positive terminal +C8. The potential lines 155 further comprises and a fourth potential line 146. The fourth potential line 146 is connected to the front-negative terminal −A6" of the lower level port 150, the rear-negative terminal −B6" of the lower level port 150, the cell negative terminal −C7, and the cell negative terminal −C8. In an embodiment, the cell positive terminal +C8 of the solar cell port 152 connects to the third potential line 145, and the cell negative terminal −C8 of the solar cell port 152 connects to the fourth potential line 146. The adapter 600 is a double-side-type adapter (B-2P type adapter). The solar cell port 152 connects to a solar cell 157 or a submodule, and the solar cell port 153 connects to a solar cell 158 or a submodule.

Figure 8:
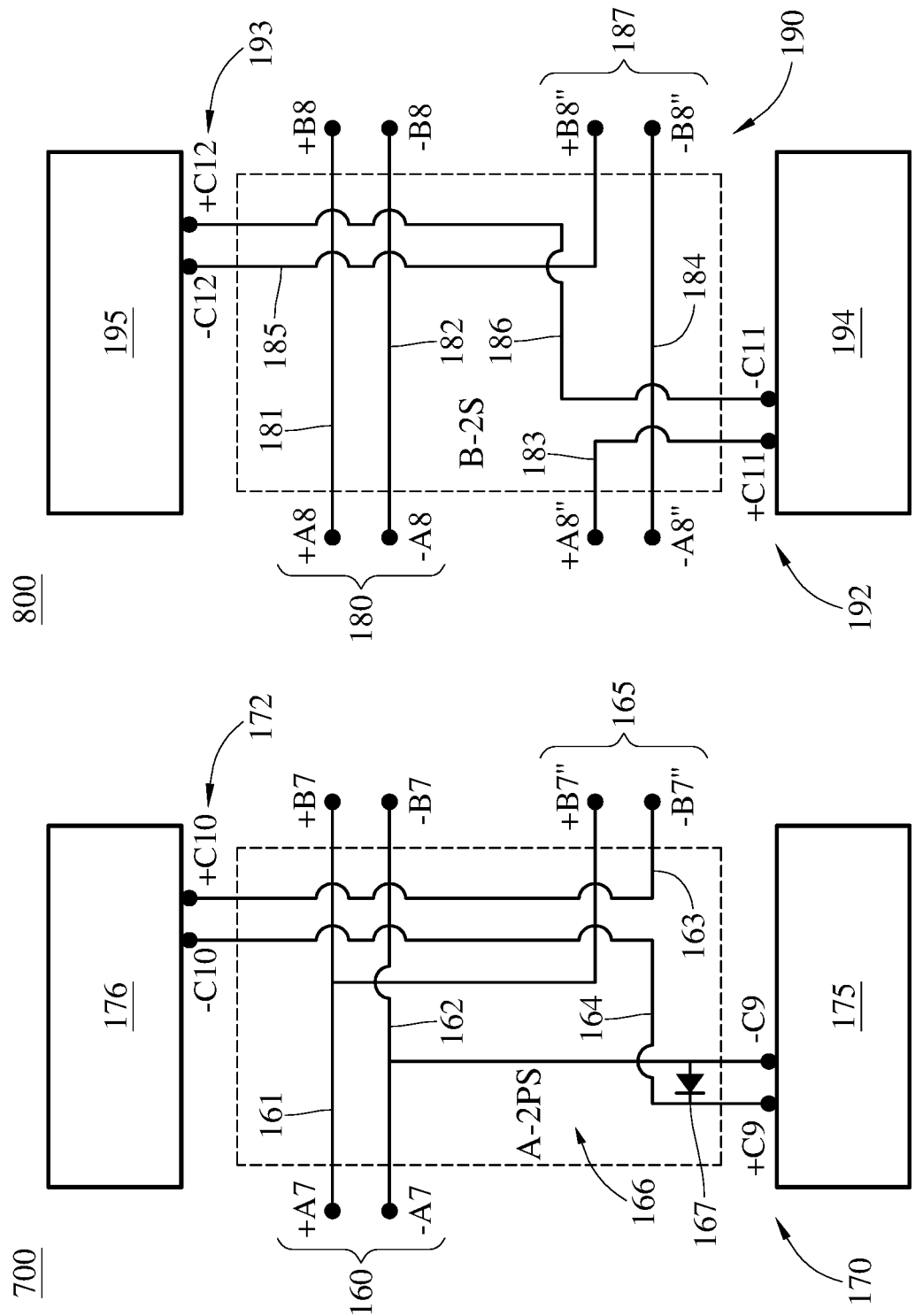
FIG. 8 is a diagram illustrating adapters in accordance with embodiments of the present disclosure.

FIG. 8 is a diagram illustrating adapters 700 and 800 in accordance with an embodiment of the present disclosure. In an embodiment, the adapter 700 is applicable to an expandable photovoltaic submodule or solar cells. The adapter 700 is also called as an A-2PS type adapter. The adapter 700 comprises: an upper level port 160, wherein the upper level port 160 comprises a front-positive terminal +A7, a front-negative terminal −A7, a rear-positive terminal +B7, and a rear-negative terminal −B7; a lower level port 165, wherein the lower level port 165 comprises a rear-positive terminal +B7" and a rear-negative terminal −B7"; a solar cell port 170, wherein the solar cell port 170 comprises a cell positive terminal +C9 and a cell negative terminal −C9; and a plurality of potential lines 166 coupled to the upper level port 160, the lower level port 165, and the solar cell port 170, wherein the plurality of potential lines 166 are adapted to series or parallel connections of at least two levels.

In an embodiment, the adapter 700 further comprises another solar cell port 172, wherein the solar cell port 172 comprises a cell positive terminal +C10 and a cell negative terminal −C10. The potential lines 166 further comprises a first potential line 161. The first potential line 161 is connected to the front-positive terminal +A7 of the upper level port 160, the rear-positive terminal +B7 of the upper level port 160, and the rear-positive terminal +B7" of the lower level port 165. In an embodiment, the potential lines 166 further comprises a second potential line 162. The second potential line 162 is connected to the front-negative terminal −A7 of the upper level port 160, the rear-negative terminal −B7 of the upper level port 160, and the cell negative terminal −C9. In an embodiment, the potential lines 166 further comprises a third potential line 163. The third potential line 163 is connected to the rear-negative terminal −B7" of the lower level port 165 and the cell positive terminal +C10 of the solar cell port 172. The potential lines 166 further comprises a fourth potential line 164. The fourth potential line 164 is connected to the cell positive terminal +C9 of the solar cell port 170 and the cell negative terminal −C10 of the solar cell port 172. The adapter 700 further comprises a by-pass diode 167 (also referred to as a protection diode). The by-pass diode 167 is located between the second potential line 162 and the fourth potential line 164. An anode of the by-pass diode 167 connects to the second potential line 162. A cathode of the by-pass diode 167 connects to the fourth potential line 164. The adapter 700 is a double-side-type adapter (A-2PS type adapter). The solar cell port 170 connects to a solar cell 175 or a submodule, and the solar cell port 172 connects to a solar cell 176 or a submodule.

In an embodiment, the adapter 800 is applicable to an expandable photovoltaic submodule or solar cells. The adapter 800 is also called as a B-2S type adapter. The adapter 800 comprises: an upper level port 180, wherein the upper level port 180 comprises a front-positive terminal +A8, a front-negative terminal −A8, a rear-positive terminal +B8, and a rear-negative terminal −B8; a lower level port 187, wherein the lower level port 187 comprises a rear-positive terminal +B8" and a rear-negative terminal −B8"; a solar cell port 192, wherein the solar cell port 192 comprises a cell positive terminal +C11 and a cell negative terminal −C11; and a plurality of potential lines 190 coupled to the upper level port 180, the lower level port 187, and the solar cell port 190, wherein the plurality of potential lines 190 are adapted to series or parallel connections of at least two levels.

In an embodiment, the potential lines 190 further comprises a first potential line 181. The first potential line 181 is connected to the front-positive terminal +A8 of the upper level port 180 and the rear-positive terminal +B8 of the upper level port 180. In an embodiment, the potential lines 190 further comprises a second potential line 182. The second potential line 182 is connected to the front-negative terminal −A8 of the upper level port 180 and the rear-negative terminal −B8 of the upper level port 180. The lower level port 187 further comprises a front-positive terminal +A8"; and a front-negative terminal −A8". The potential lines 190 further comprises a third potential line 183. The third potential line 183 is connected to the front-positive terminal +A8" of the lower level port 187 and the cell positive terminal +C11. The potential lines 190 further comprises a fourth potential line 184. The fourth potential line 184 is connected to the front-negative terminal −A8" of the lower level port 187 and the rear-negative terminal −B8" of the lower level port 187. The adapter 800 further comprises a solar cell port 193, wherein the solar cell port 193 comprises a cell positive terminal +C12 and a cell negative terminal −C12. The potential lines 190 further comprises a fifth potential line 185. The fifth potential line 185 is connected to the rear-positive terminal +B8" of the lower level port 187 and the cell negative terminal −C12 of the solar cell port 193. The potential lines 190 further comprises a sixth potential line 186. The sixth potential line 186 is connected to the cell negative terminal −C11 of the solar cell port 192 and the cell positive terminal +C12 of the solar cell port 193. The adapter 800 is a double-side-type adapter (B-2S type adapter). The solar cell port 192 connects to a solar cell 194 or a submodule, and the solar cell port 193 connects to a solar cell 195 or a submodule.

Figure 9:
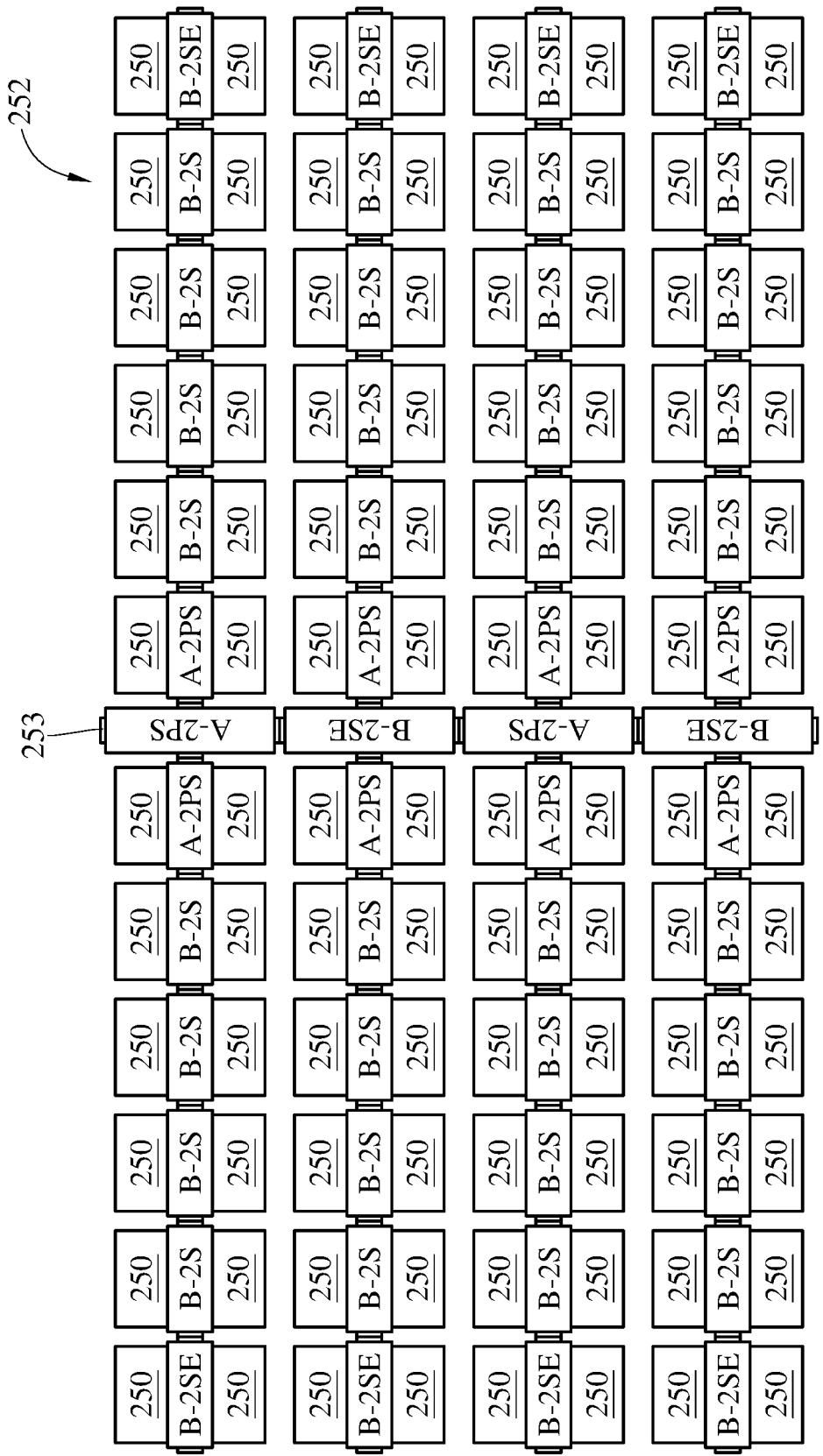
FIG. 9 is a diagram illustrating assembling of solar cells by using adapters in accordance with an embodiment of the present disclosure.

FIG. 9 is a diagram illustrating assembling of solar cells by using adapters in accordance with an embodiment of the present disclosure. In the embodiment, each solar cell 250 has an output voltage of 0.5 volts (V), an output current of 2 amperes (A), and an output power of 1 watt (W). Each row 252 has an A-2PS type adapter, four B-2S type adapters, and a B-2SE type adapter. In a vertical direction, two A-2PS type adapters and two B-2SE type adapters are connected in series. Two sides of the A-2PS type adapters and the B-2SE type adapters respectively connect to two rows 252 in series. The B-2SE type adapter is referred to as a B-2S type adapter connected to a tail-short-circuit end. The A-2PS type adapter has an output terminal 253. The whole solar cell module has an output voltage of 24.0 volts (V) (0.5 volts per solar cell 250*12 solar cells 250 per row 252 in a series connection*4 rows 252 in a series connection), an output current of 4.0 amperes (A) (2 A in each group*2 groups in a parallel connection), and a total output power of 96 watts (W).

Figure 10A:
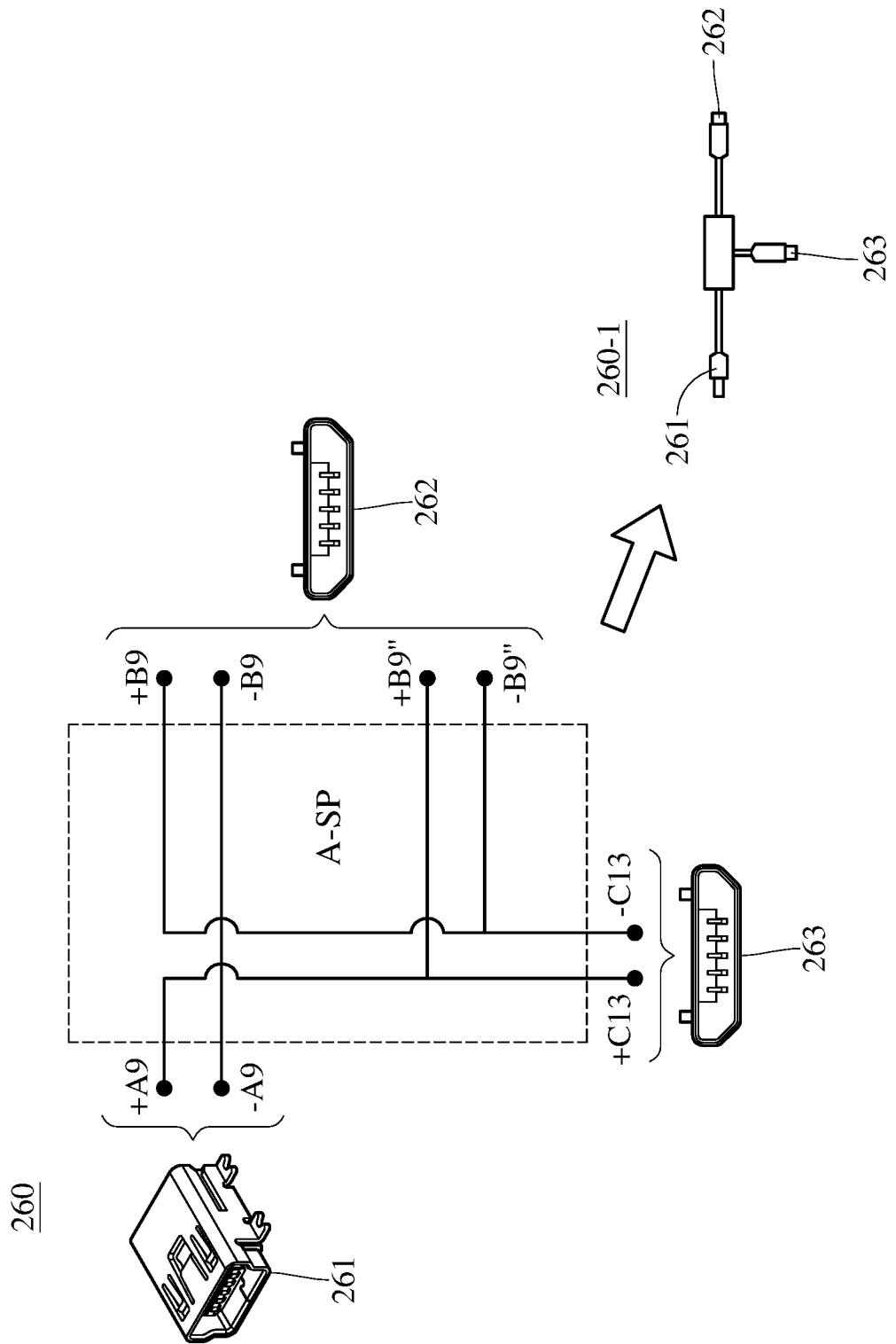
FIG. 10A is a diagram illustrating an adapter in accordance with embodiments of the present disclosure.

FIG. 10A is a diagram illustrating the adapter 260 in accordance with embodiments of the present disclosure. In an embodiment, the adapter 260 is an A-SP type adapter. A front-positive terminal +A9 and a front-negative terminal −A9 of the adapter 260 are integrated as a port 261. The port 261 is a type of Micro-B 5P universal serial bus (USB) connector, wherein the port 261 is a female end. The port 261 meets general needs of large power. A rear-positive terminal +B9, a rear-negative terminal −B9, a rear-positive terminal +B9", and a rear-negative terminal −B9" of the adapter 260 are integrated as a port 262. The port 262 is a type of Micro-B 5P universal serial bus (USB) connector, wherein the port 262 is a male end. In an embodiment, a cell positive terminal +C13 and a cell negative terminal −C13 of the adapter 260 are integrated as a port 263. The port 263 is a type of Micro-B 5P universal serial bus (USB) connector, wherein the port 263 is a male end. Therefore, a female end of solar cells (not shown) is compatible with the port 263 so that the port 263 may connect to solar cells/submodules. The aforementioned ports may be implemented by other types of universal serial bus (USB), but not limited thereto. A male end or a male end of the type Micro-B 5P connector may connect to 5 wires at most. If needed, a surplus wire may be used as grounding for solar cells. In an embodiment, a schematic view of the outward appearance of the adapter 260 is shown as an adapter 260-1. The front-positive terminal +A9 and the front-negative terminal −A9 are integrated as the port 261. The cell positive terminal +C13 and the cell negative terminal −C13 are integrated as the port 263. The rear-positive terminal +B9, the rear-negative terminal −B9, the rear-positive terminal +B9", and the rear-negative terminal −B9" are integrated as a port 262.

FIG. 10B is a diagram illustrating the adapter 270 in accordance with embodiments of the present disclosure. In an embodiment, the adapter 270 is a B-P type adapter. A front-positive terminal +A10 (at an upper level), a front-negative terminal −A10 (at the upper level), a front-positive terminal +A10" (at a lower level), and a front-negative terminal −A10" (at the lower level) of the adapter 270 are integrated as a port 271. The port 271 is a type of Micro-B 5P universal serial bus (USB) connector, wherein the port 271 is a female end. A rear-positive terminal +B10 (at the upper level), a rear-negative terminal −B10 (at the upper level), a rear-positive terminal +B10" (at the lower level), and a rear-negative terminal −B10" (at the lower level) of the adapter 270 are integrated as a port 272. The port 272 is a type of Micro-B 5P universal serial bus (USB) connector, wherein the port 272 is a male end. In an embodiment, a schematic view of the outward appearance of the adapter 270 is shown as an adapter 270-1 in FIG. 10B. The front-positive terminal +A10, the front-negative terminal −A10, the front-positive terminal +A10", and the front-negative terminal −A10" are integrated as a port 271. A cell positive terminal +C14 and a cell negative terminal −C14 are integrated as a port 273. An output terminal of a solar cell (not shown) is a female end so that the port 273 is able to connect the solar cell. The rear-positive terminal +B10, the rear-negative terminal −B10, the rear-positive terminal +B10", and the rear-negative terminal −B10" are integrated as the port 272. In an embodiment, the port 262 is compatible with the port 271 so that solar cells associated with the adapters 260 and 270 are connected together.

Figure 11A:
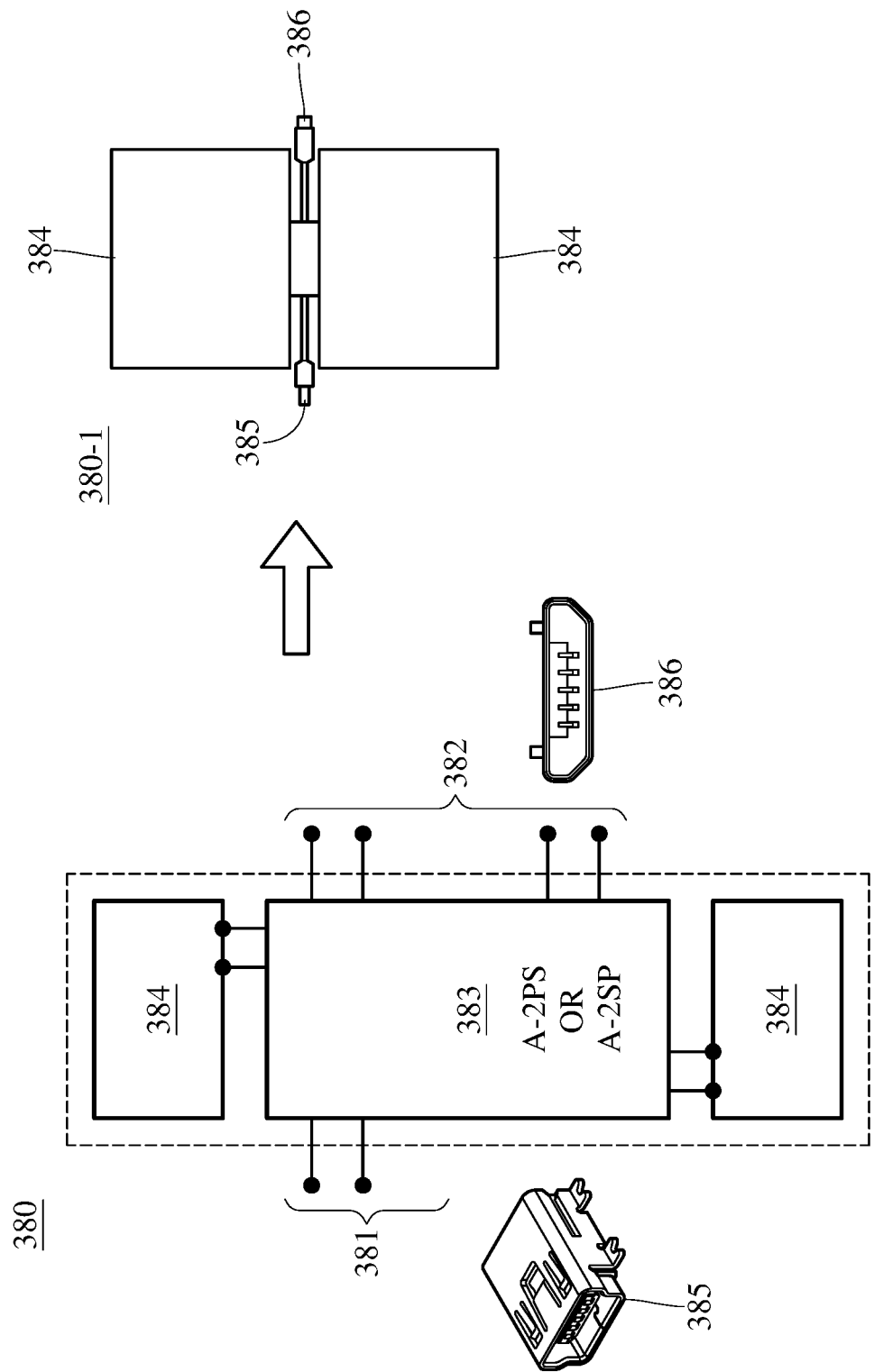
FIG. 11A is a diagram illustrating a photovoltaic submodule in accordance with an embodiment of the present disclosure.

FIG. 11A is a diagram illustrating a photovoltaic submodule 380 in accordance with an embodiment of the present disclosure. The photovoltaic submodule 380 comprises an adapter 383 and two solar cells 384. In the embodiment, the adapter 383 may be an A-2PS type adapter (such as the adapter 700) or an A-2SP adapter (such as the adapter 500). The adapter 383 has a front-upper-level port 381, wherein the front-upper-level port 381 is integrated as a port 385. The port 385 is a type of Micro-B 5P universal serial bus (USB) connector, wherein the port 385 is a female end. The adapter 383 has a rear-upper-lower-level port 382. The rear-upper-lower-level port 382 is integrated as a port 386. The port 386 is a type of Micro-B 5P universal serial bus (USB) connector, wherein the port 386 is a male end. A schematic view of the outward appearance of the photovoltaic submodule 380 is shown as a photovoltaic submodule 380-1.

Figure 11B:
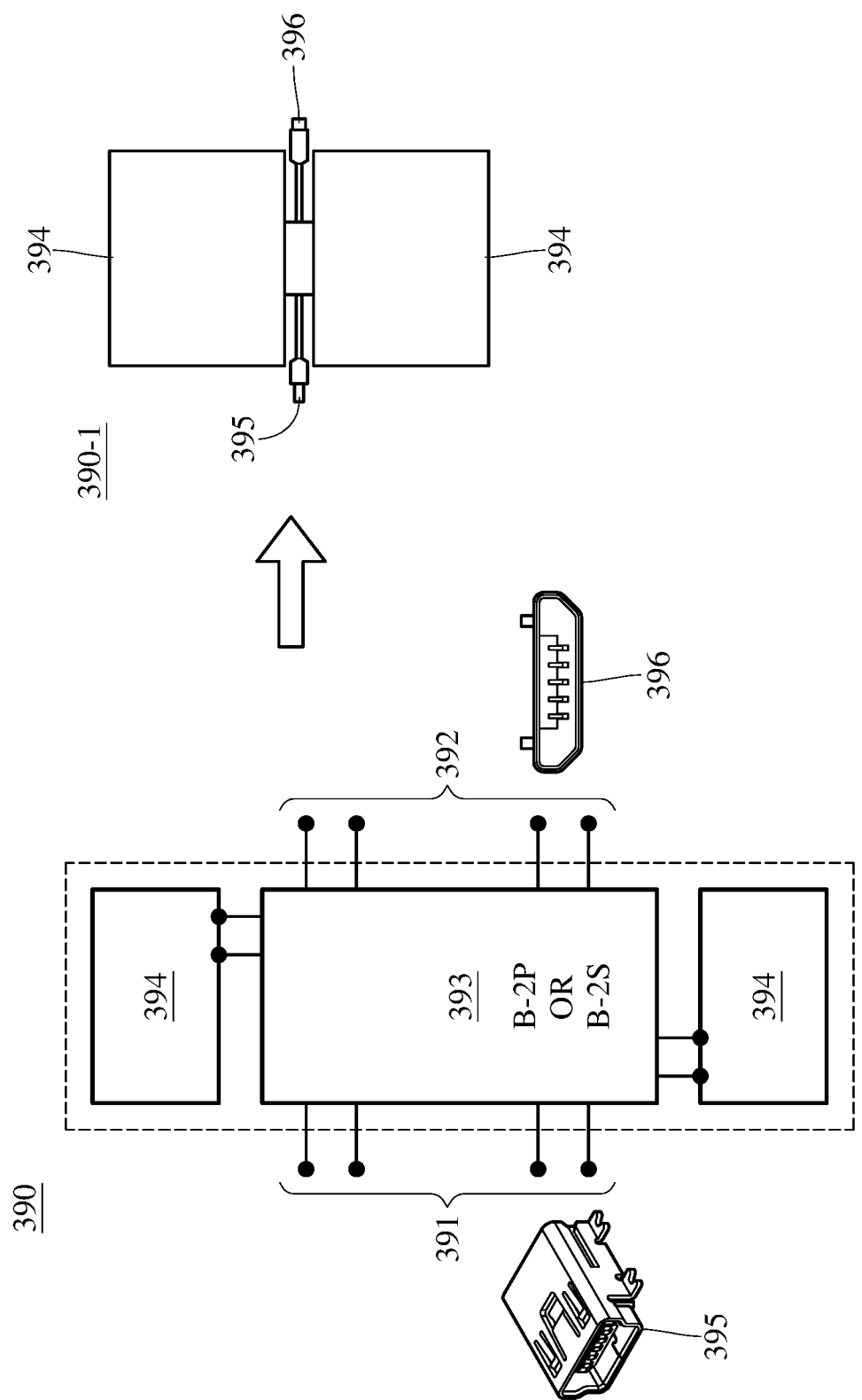
FIG. 11B is a diagram illustrating a photovoltaic submodule in accordance with embodiments of the present disclosure.

FIG. 11B is a diagram illustrating a photovoltaic submodule 390 in accordance with embodiments of the present disclosure. The photovoltaic submodule 390 comprises an adapter 393 and two solar cells 394. The adapter 393 may be a B-2P type adapter (such as the adapter 600) or a B-2S adapter (such as the adapter 800). The adapter 393 has a front-upper-lower-level port 391, wherein the front-upper-lower-level port 391 is integrated as a port 395. The port 395 is a type of Micro-B 5P universal serial bus (USB) connector, wherein the port 395 is a female end. The adapter 393 has a rear-upper-lower-level port 392. The rear-upper-lower-level port 392 is integrated as a port 396. The port 396 is a type of Micro-B 5P universal serial bus (USB) connector, wherein the port 396 is a male end. A schematic view of the outward appearance of the photovoltaic submodule 390 is shown as a photovoltaic submodule 390-1.

In the embodiments described above, regarding each of the USB ports, the types of the male end and the female end may be interchanged. For example, the port 395 is changed to a male end. The port 396 is changed to a female end. Their achievements of wiring are the same so that the types of the male end and the female end are not limited thereto.

The present disclosure provides expandable photovoltaic submodules and adapters applicable to solar cells. The adapters may be regarded as double tier exchangers or combiners. The connecting loop of the adapters may achieve series connections and/or parallel connections for solar cells/submodules. According to requirements, solar cells and adapters are flexibly combined as a photovoltaic module having the specific output voltage, output current, and output power.

It will be apparent to those skilled in the art that various modifications and variations can be made to the disclosed embodiments. It is intended that the specification and examples be considered as exemplary embodiments only, with a scope of the disclosure being indicated by the following claims and their equivalents.

| | | | |
|---|---|---|---|
| 10 | upper level port | 12 | first potential line |
| 13 | second potential line | 14 | third potential line |
| 20 | lower level port | 25 | potential line |
| 30 | solar cell port | 32 | solar cell |
| 40 | upper level port | 42 | first potential line |
| 43 | second potential line | 45 | third potential line |
| 46 | fourth potential line | 50 | lower level port |
| 52 | solar cell port | 55 | potential line |
| 57 | solar cell | 60 | upper level port |
| 61 | first potential line | 62 | second potential line |
| 63 | third potential line | 65 | lower level port |
| 66 | potential line | 67 | by-pass diode |
| 68 | solar cell | 70 | solar cell port |
| 80 | upper level port | 82 | first potential line |
| 83 | second potential line | 84 | third potential line |
| 85 | fourth potential line | 86 | fifth potential line |
| 87 | potential line | 90 | lower level port |
| 92 | solar cell port | 93 | solar cell |
| 100 | adapter | 110 | upper level port |
| 112 | first potential line | 113 | second potential line |
| 114 | third potential line | 120 | lower level port |
| 123 | solar cell | 124 | solar cell |
| 125 | potential line | 130 | solar cell port |
| 132 | solar cell port | 140 | upper level port |
| 142 | first potential line | 143 | second potential line |
| 145 | third potential line | 146 | fourth potential line |
| 150 | lower level port | 152 | solar cell port |
| 153 | solar cell port | 155 | potential line |
| 157 | solar cell | 158 | solar cell |
| 160 | upper level port | 161 | first potential line |
| 162 | second potential line | 163 | third potential line |
| 164 | fourth potential line | 165 | lower level port |
| 166 | potential line | 167 | by-pass diode |
| 170 | solar cell port | 172 | solar cell port |
| 175 | solar cell | 176 | solar cell |
| 180 | upper level port | 181 | first potential line |
| 182 | second potential line | 183 | third potential line |
| 184 | fourth potential line | 185 | fifth potential line |
| 186 | sixth potential line | 187 | lower level port |
| 190 | potential line | 192 | solar cell port |
| 193 | solar cell port | 194、195 | solar cell |
| 200 | adapter | 210 | adapter |
| 211 | adapter | 212 | adapter |
| 213 | adapter | 216 | front-upper-level ports |
| 217 | lower level port | 218 | solar cell |

| | | | |
|---|---|---|---|
| 219 | rear-upper-level ports | | |
| 220 | solar cell | 222 | row |
| 223 | output terminal | 230 | solar cell |
| 232 | row | 233 | output terminal |
| 240 | solar cell | 242 | row |
| 243 | output terminal | 250 | solar cell |
| 252 | row | 253 | output terminal |
| 260 | adapter | 260-1 | adapter |
| 261 | port | 262 | port |
| 263 | port | | |
| | | 266 | port |
| 267 | port | 268 | port |
| 270 | adapter | 270-1 | adapter |
| 271 | port | 272 | port |
| 273 | port | 280 | photovoltaic submodule |
| 280-1 | photovoltaic submodule | 281 | front-upper-level port |
| 282 | rear-upper-lower-level port | 283 | adapter |
| 284 | solar cell | 285 | port |
| 286 | port | 290 | photovoltaic submodule |
| 290-1 | photovoltaic submodule | 291 | front-upper-lower-level port |
| 292 | rear-upper-lower-level port | 293 | adapter |
| 294 | solar cell | 295 | port |
| 296 | port | | |
| 300 | adapter | 380 | photovoltaic submodule |
| 380-1 | photovoltaic submodule | 381 | front-upper-level port |
| 382 | rear-upper-lower-level port | 383 | adapter |
| 384 | solar cell | 385 | port |
| 386 | port | | |
| 390 | photovoltaic submodule | 390-1 | photovoltaic submodule |
| 391 | front-upper-lower-level port | 392 | rear-upper-lower-level port |
| 393 | adapter | 394 | solar cell |
| 395 | port | 396 | port |
| | | 400 | adapter |
| 500 | adapter | 600 | adapter |
| 700 | adapter | 800 | adapter |
| A-SP | A-SP type adapter | B-P B-P | type adapter |
| A-PS | A-PS type adapter | B-S B-S | type adapter |
| A-2SP | A-2SP type adapter | B-2P B-2P | type adapter |
| A-2PS | A-2PS type adapter | B-2S B-2S | type adapter |
| A-2SE | A-2SE type adapter | | |
| +A1、+A2、+A3、+A4、+A5、+A6、+A7、+A8、+A9、+A10 front-positive terminal | | | |
| −A1、−A2、−A3、−A4、−A5、−A6、−A7、−A8、−A9、−A10 front-negative terminal | | | |
| +B1、+B2、+B3、+B4、+B5、+B6、+B7、+B8、+B9、+B10 rear-positive terminal | | | |
| −B1、−B2、−B3、−B4、−B5、−B6、−B7、−B8、−B9、−B10 rear-negative terminal | | | |
| +A2"、+A4"、+A6"、+A8"、+A10" front-positive terminal | | | |
| −A2"、−A4"、−A6"、−A8"、−A10" front-negative terminal | | | |
| +B1"、+B2"、+B3"、+B4"、+B5"、+B6"、+B7"、+B8"、+B9"、+B10" rear-positive terminal | | | |
| −B1"、−B2"、−B3"、−B4"、−B5"、−B6"、−B7"、−B8"、−B9"、−B10" rear-negative terminal | | | |
| +C1、+C2、+C3、+C4、+C5、+C6、+C7、+C8、+C9、+C10、+C11、+C12、+C13、+C14 cell positive terminal | | | |
| −C1、−C2、−C3、−C4、−C5、−C6、−C7、−C8、−C9、−C10、−C11、−C12、−C13、−C14 cell negative terminal | | | |

What is claimed is:

1. An adapter for solar cell comprising:
   a first port, wherein the first port comprises a first positive terminal, a first negative terminal, a second positive terminal, and a second negative terminal;
   a second port, wherein the second port comprises a third positive terminal and a third negative terminal;
   a first solar cell port, wherein the first solar cell port comprises a cell positive terminal and a cell negative terminal that are configured to be connected to a solar cell;
   a first potential line directly electrically connected to the first positive terminal of the first port, the third positive terminal of the second port, and the cell positive terminal;
   a second potential line directly electrically connected to the first negative terminal of the first port and the second negative terminal of the first port but not directly electrically connected to the second port and the first solar cell port; and
   a third potential line directly electrically connected to the second positive terminal of the first port, the third negative terminal of the second port, and the cell negative terminal but not directly electrically connected to the first positive terminal, the first negative terminal, the third positive terminal of the second port, and the cell positive terminal of the first solar cell port.

2. The adapter for solar cell according to claim 1, wherein the adapter comprises:
   a second solar cell port, wherein the second solar cell port comprises a cell positive terminal and a cell negative terminal, and the cell positive terminal of the second solar cell port connects to the first potential line, and the cell negative terminal of the second solar cell port connects to the third potential line.

\* \* \* \* \*